United States Patent

Gregor et al.

[15] 3,658,678

[45] Apr. 25, 1972

[54] GLASS-ANNEALING PROCESS FOR ENCAPSULATING AND STABILIZING FET DEVICES

[72] Inventors: Lawrence V. Gregor, Hopewell Junction, N.Y.; Markus Zuegel, Baden, Wurttemberg, Germany

[73] Assignee: International Business Machines Corporation, Armonk, N.Y.

[22] Filed: Nov. 26, 1969

[21] Appl. No.: 880,266

[52] U.S. Cl. ....................204/192

[51] Int. Cl. ....................C23c 15/00

[58] Field of Search ....................204/192

[56] References Cited

UNITED STATES PATENTS

| | | | |
|---|---|---|---|
| 3,419,761 | 12/1968 | Pennebaker | 204/192 |
| 3,432,417 | 3/1969 | Davidse et al. | 204/192 |
| 3,343,049 | 9/1967 | Miller et al. | 317/234 |
| 3,451,912 | 6/1969 | D'Heurle et al. | 204/192 |
| 3,450,581 | 6/1969 | Shortes | 204/192 |

*Primary Examiner*—Howard S. Williams

*Assistant Examiner*—Sidney S. Kanter

*Attorney*—Hanifin and Jancin and Robert J. Haase

[57] ABSTRACT

A process is described for passivating completed FET devices by encapsulation. High purity silicon dioxide is deposited on the completed field effect transistor (FET) device by the RF sputtering of a high purity silicon dioxide target in an inert atmosphere. The sputtered silicon dioxide layer is made approximately 1.5 times the thickness of the FET gate. Then, the device is annealed in a non-oxidizing atmosphere to restore the threshold voltage of the FET to its desired value prior to sputtering. Appropriate ranges are disclosed for the values of the temperature and the RF power density of the sputtering step and for the temperature and the time of the annealing step.

5 Claims, 1 Drawing Figure

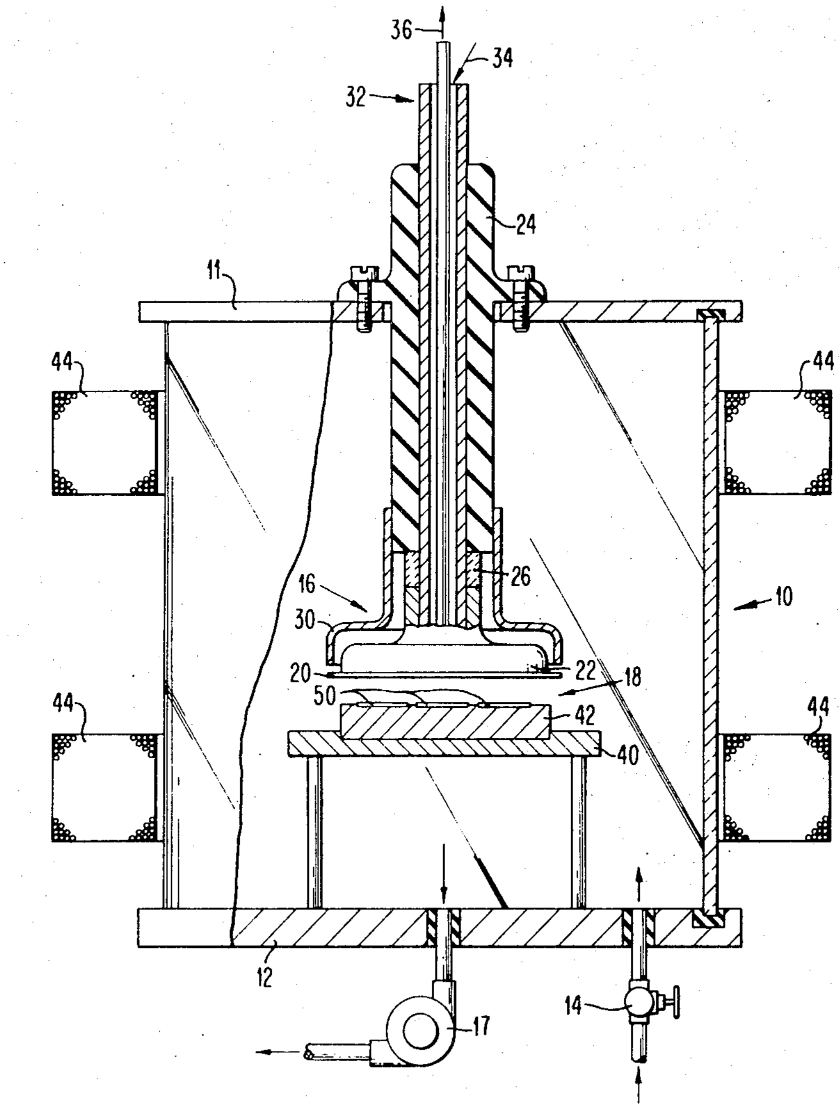
INVENTORS
LAWRENCE V. GREGOR
MARKUS ZUEGEL
BY Robert J. Haase
ATTORNEY

GLASS-ANNEALING PROCESS FOR ENCAPSULATING AND STABILIZING FET DEVICES

BACKGROUND OF THE INVENTION

One of the outstanding advantages of insulated gate field effect transistors is the relatively few processing steps required for fabrication. Processing simplicity, however, is not always matched by reproducibility. Insulated gate field effect transistors are notoriously sensitive to environment and contamination, particularly sodium ion contamination during fabrication, causing instability in electrical characteristics. In particular, the threshold voltage of the field effect transistor is subject to variation with respect to its age and with respect to the production run in which it was made.

It has previously been known that some of the electrical instabilities peculiar to field effect transistors can be reduced by special processing of the gate dielectric layer. U.S. Pat. No. 3,343,049 issued on Sept. 19, 1967 to W. H. Miller, et al., and assigned to the present assignee teaches that device stability can be improved by the deposition of a vitreous film consisting of an oxide and phosphorous pentoxide on the gate dielectric material. The gate electrode is placed on top of the vitreous film. Such prior art processes, however, do not fulfill the need for an encapsulation and long-term stabilization process for the completed FET device.

SUMMARY OF THE INVENTION

In accordance with the present invention, long-term stabilization of the completed FET devices is accomplished by a two step sputtering-annealing process. In the first step of the process, an insulating material such as silicon dioxide, silicon nitride or combinations thereof, is RF sputtered in an inert atmosphere on an electrically grounded FET device. Sputtering is continued until a layer approximately 1.5 times the thickness of the gate is built up. Unfortunately, the sputtering step introduces an unacceptable threshold voltage shift in the FET. It has been found, however, that said shift can be reduced to acceptable magnitude by an annealing step at temperatures non-injurious to the completed FET.

BRIEF DESCRIPTION OF THE DRAWING

The sole FIGURE is a simplified sectional view of a sputtering system suitable for the deposition of the oxide encapsulation coating in accordance with the present invention.

DESCRIPTION OF THE PREFERRED EMBODIMENT

The present invention is fully compatible with conventional field effect transistor manufacturing methods. Accordingly, only a brief description of an exemplary prior art process for manufacturing field effect transistors will be given for background information purposes. As is well understood, a large number of FET devices are processed simultaneously on a common semiconductor wafer. The individual FET devices may be separated from each other at the completion of the processing steps for utilization as discrete devices. Alternatively, the individual FET devices may remain in large array configurations on respective portions of the wafer where, for example, computer memory or storage utilizations are desired. For the sake of simplicity and clarity of exposition, however, the following discussion will be limited to the conventional fabrication steps in the manufacture of a single FET device.

A semiconductor wafer of desired conductivity type, e.g., P-conductivity type silicon, is coated with a silicon dioxide masking layer into which source and drain windows are etched by a photoresist process. A suitable impurity, for example, phosphorous, is diffused into the silicon wafer via the source and drain windows to convert the P-conductivity type wafer into controlled and localized areas of N-conductivity type underlying the source and drain windows. At this point a relatively critical step is reached in the prior art process whereby the gate dielectric layer of the FET device is formed. This is achieved by first etching away the oxide layer over the channel between the source and drain and then regrowing the gate oxide to a prescribed thickness. At the present time, the practice is to regrow a layer of silicon dioxide of approximately 500 angstroms thickness. The regrown oxide then is doped with phosphorous in the manner of the aforementioned U.S. Pat. No. 3,343,049 for electrical stabilization purposes. Finally, electrode contact material, for example, aluminum, is evaporated on the source, drain and gate dielectric areas and the completed FET device is annealed.

The completed FET device is now in a condition for final encapsulation for long-term passivation and for protection. Of course, the encapsulation process should be one which provides the desired electrical stabilization without adversely affecting the existing characteristics of the FET device. The present invention is directed to the achievement of these ends.

The single FIGURE of the drawing represents in simplified form a typical radio frequency sputtering apparatus suitable for the deposition of silicon dioxide encapsulating material on a completed FET device in accordance with the method of the present invention. The sputtering apparatus is described in more detail in patent application Ser. No. 428,733 filed Jan. 28, 1965 in the names of P. D. Davidse and L. I. Maissel, now U.S. Pat. No. 3,432,417, assigned to the present assignee. Briefly, the apparatus comprises a chamber 10 having a top plate 11 and being removably mounted on base plate 12. A suitable gas can be admitted to the chamber 10 through a valve 14. The desired pressure in the chamber is maintained by vacuum pump 17. It is preferred that argon gas in the pressure range from about one to about $20 \times 10^{-3}$ millimeters of mercury be maintained in chamber 10 during the sputtering step of the present invention. Within the gas filled enclosure are positioned a target electrode structure 16 and a substrate support structure 18.

Target electrode assembly 16 includes a target 20 which is composed of the material to be sputtered, preferably, silicon dioxide, silicon nitride or combinations thereof. Mounted on or positioned adjacent to the target 20 is the cathode electrode 22. Cathode 22 is insulated from the supporting column 24 by means of a ceramic seal 26. The supporting column 24 is attached to the top plate 11 of the sputtering apparatus 10. A grounded shield 30 is supported by post 24. The shield 30 partially encloses cathode 22 and protects it from unwanted sputtering. A cooling structure 32 having inlet and outlet ports 34 and 36, respectively, is centrally located within post 24. The cooling structure 32 can be used to cool the electrode structure, if necessary, by circulating water or other fluid coolant through the coolant structure 32. The cooling structure 32 also serves as the electrical conductor through post 24 to connect cathode electrode 22 with a radio frequency power source (not shown).

This substrate support structure 18 includes a support means 40 which is mounted on the base plate 12 of the sputtering apparatus 10. The semiconductor wafers 50 are positioned on substrate holder 42 which, in turn, is positioned on the upper surface of the support means 40. Either cooling coils or heating means can be positioned within or adjacent to the substrate holder 42 for cooling or heating the wafers 50. The support structure 18 is connected as the anode electrode of the sputtering apparatus. Electromagnets 44 preferably are used to concentrate the glow discharge and to enhance the efficiency of the sputtering action.

Although sputtering-annealing processes for passivating semiconductor devices by encapsulation are known in the prior art, e.g., the aforementioned U.S. Pat. No. 3,432,417 and Ser. No. 539,210 filed Mar. 31, 1966 now U.S. Pat. No. 3,508,209 for Monolithic Integrated Structure Including Fabrication and Package Therefor in the names of B. Agusta, P. H. Bardell, P. P. Castrucci, R. A. Henle and R. P. Pecoraro and assigned to the present assignee, they are not known to have been applied to field effect transistors. Sputtering processes are vigorous in their action and normally would not be expected to be suitable for the processing of field effect transistors which are notoriously sensitive to environment and to contamination which adversely affect device electrical stability. In accordance with the present invention, however, it has been discovered that when the sputtering system parameter values are within certain ranges and the sputtering step is followed by an annealing cycle of appropriate temperature and time ranges, passivation by encapsulation can be accomplished without objectionally reducing the electrical stability of the FET devices. More particularly, experimental evidence has been obtained that useful stabilization can be achieved when the sputtering and annealing parameter values are in the following parameter value ranges:

Sputtering Parameter Ranges

| | |
|---|---|
| RF power density | 1 to 6 watts per sq. centimeter |
| FET device temperature | 250° C. to 300° C. |

Annealing Parameter Ranges

| | |
|---|---|
| FET device temperature | 400° C. to 450° C. |
| Annealing time | 5 minutes to 30 minutes |

The term "power density" in the above table is defined as the ratio between the RF power input to the sputtering apparatus represented in the drawing to the area of the target electrode (target 20). A magnetic field strength of about 30 gauss between the an anode and cathode of the sputtering apparatus has been found desirable but not critical to the operation of the present invention. The magnetic field may even be dispensed with where sputtering efficiency is maintained by other conventional means such as, for example, by anode tuning techniques. Argon pressure within the range from about one to about $20 \times 10^{-3}$ millimeters of mercury preferably should be maintained within the sputtering chamber although other inert atmospheres are suitable. It is convenient to use atmospheric pressure of a non-oxidizing gas such as nitrogen or forming gas during the annealing step. Satisfactory results may also be obtained at other pressures.

It should be noted that the anode structure of the sputtering apparatus represented by the drawing is electrically grounded to the base plate 12. It has been found necessary to provide good electrical contact between the FET devices and the anode structure during sputtering to avoid the accumulation of electrical charge within the semiconductor wafer structure of the FET devices. Sufficient grounding of the fet devices to the anode structure can be achieved by depositing a thin coating of gallium to the bottom surfaces of the FET wafers making contact with the anode structure.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A method for producing an insulated gate field effect transistor having a metallic gate electrode comprising the steps of:

radio frequency sputtering in an inert atmosphere target electrode material selected from the group consisting of silicon dioxide and silicon nitride over said transistor having a metallic gate electrode to encapsulate said transistor whereby the threshold voltage of said transistor is shifted, and annealing said transistor in a non-oxidizing atmosphere at a temperature and for a time non-injurious to said transistor so as to substantially reduce said threshold voltage shift, the ratio between the radio frequency sputtering input power and the area of said target electrode being in the range from about one to about 6 watts per square centimeter, the temperature of said transistor being in the range from about 250° C. to about 300° C. during said sputtering step, and the temperature of said transistor being in the range from about 400° C. to about 450° C. for a time within the range from about 5 minutes to about 30 minutes during said annealing step.

2. The method defined in claim 1 wherein the gate dielectric comprises silicon dioxide and the gate electrode comprises aluminum.

3. The method defined in claim 1 wherein said inert atmosphere comprises argon in the pressure range from about one to about $20 \times 10^{-3}$ millimeters of mercury.

4. The method defined in claim 1 wherein said non-oxidizing atmosphere is selected from the group consisting of nitrogen and forming gas.

5. The method defined in claim 1 wherein said transistor is electrically grounded during said sputtering step.

* * * * *